United States Patent
Sipilä et al.

(10) Patent No.: US 7,727,796 B2
(45) Date of Patent: Jun. 1, 2010

(54) METHOD FOR PATTERNING DETECTOR CRYSTAL USING Q-SWITCHED LASER

(75) Inventors: Heikki Johannes Sipilä, Espoo (FI); Hans Andersson, Vantaa (FI); Seppo Nenonen, Espoo (FI); Juha Jouni Kalliopuska, Helsinki (FI)

(73) Assignee: Oxford Instruments Analytical Oy (FI)

( * ) Notice: Subject to any disclaimer, the term of this patent is extended or adjusted under 35 U.S.C. 154(b) by 0 days.

(21) Appl. No.: 11/796,104

(22) Filed: Apr. 26, 2007

(65) Prior Publication Data

US 2008/0265358 A1    Oct. 30, 2008

(51) Int. Cl.
*H01L 31/0248* (2006.01)
*H01L 31/072* (2006.01)
(52) U.S. Cl. .......... 438/98; 257/459; 257/461; 257/E31.002; 257/E31.12
(58) Field of Classification Search .......... 438/98; 257/459, 461, E31.002, E31.12
See application file for complete search history.

(56) References Cited

U.S. PATENT DOCUMENTS

| 6,162,658 | A | 12/2000 | Green et al. |
| 7,338,829 | B2 * | 3/2008 | Protic et al. .......... 438/48 |
| 2004/0146075 | A1 * | 7/2004 | Kennedy et al. .......... 372/10 |
| 2004/0178461 | A1 * | 9/2004 | Protic et al. .......... 257/428 |
| 2004/0222358 | A1 | 11/2004 | Bui et al. |
| 2007/0153841 | A1 * | 7/2007 | Sun .......... 372/10 |
| 2007/0176200 | A1 | 8/2007 | Hatanaka et al. |
| 2008/0067622 | A1 | 3/2008 | Bui et al. |
| 2009/0039275 | A1 * | 2/2009 | Takeishi et al. .......... 250/370.08 |

OTHER PUBLICATIONS

Communication from European Patent Application No. 08167085.3 with European Search Report (6 pages).

* cited by examiner

*Primary Examiner*—Matthew Smith
*Assistant Examiner*—Walter H Swanson
(74) *Attorney, Agent, or Firm*—Wood, Phillips, Katz, Clark & Mortimer

(57) ABSTRACT

A semiconductor radiation detector crystal is patterned by using a Q-switched laser to selectively remove material from a surface of said semiconductor radiation detector crystal, thus producing a groove in said surface that penetrates deeper than the thickness of a diffused layer on said surface.

11 Claims, 2 Drawing Sheets

METHOD FOR PATTERNING DETECTOR CRYSTAL USING Q-SWITCHED LASER

TECHNICAL FIELD

The invention concerns in general the technology of solid-state semiconductor-based radiation detectors. Especially the invention concerns the problem of patterning a detector element, which essentially consists of a semiconductor piece with a PN junction on one side.

BACKGROUND OF THE INVENTION

The use of solid-state radiation detectors is based on exposing a semiconductor piece to incoming radiation. The interaction of a received photon with the semiconductor material creates a number of electron/hole pairs, also referred to as free charge carriers. At least one species of free charge carriers are accumulated to electrodes connected to the semiconductor material, and the amount of electric charge thus collected is measured. The total amount of collected charge reveals the original energy of the received photon. If the detector has spatial resolution, detecting the location at which the charge cloud was created enables using the measurement results for imaging. The semiconductor piece is often referred to as the crystal, because detectors of best quality require a single-crystal semiconductor piece with as few lattice faults as possible.

Patterning a detector crystal may have various aims. Dividing the detector crystal into discrete pixels enables making an imaging detector, in which the charge collected by each pixel can be read separately. Even if the detector is not meant for imaging, patterns on the crystal surface may be used as guard structures that control and limit the flow of charges in the crystal.

Known methods for patterning a detector crystal include at least photolithography and ion beam based methods. The former refers to a family of processes, the common features of which include depositing a photoresist on a surface to be patterned, selectively hardening the photoresist through exposure to light, and utilizing the chemical differences between hardened and non-hardened photoresist to etch out desired portions of the surface beneath the photoresist. Ion beam deposition may also use a photoresist, but the eventual mechanism of actual pattern production is not chemical etching but ions abrading away the areas not covered by the photoresist. Focused ion beam techniques are also available and can be used for example to directly inject new material onto the surface to be patterned.

The above-mentioned methods are not sufficient for good results in all patterning applications. As an example we may consider the case of FIG. 1, which shows a cadmium telluride (CdTe) detector crystal 101 with a diffused indium layer 102 on its back surface. The front surface has a thin contact layer 103 made of a metal, like gold, platinum or palladium. The terms "front" and "back" are here used in the conventional sense to tell that the radiation to be detected is meant to enter through that surface that has the metal contact layer 103. The thicknesses of the layers are not to scale. In practice, the thickness of the detector crystal 101 could be in the order of millimeters, the thickness of the diffused indium layer 102 could be in the order of tens of micrometers, and the thickness of the metal contact layer 103 could be in the order of nanometers.

It would be relatively easy to add spatial resolution to the detector of FIG. 1 by patterning the metal contact layer 103 with e.g. photolithographic methods. However, using the front surface for patterning would mean that also the readout electronics should be located on the front surface of the detector, where they may interfere with the incoming radiation. The diffused indium layer 102 is typically too thick (in the order of some tens of micrometers) to be patterned with e.g. photolithography.

Basically it would be possible to replace the thick diffused indium layer 102 with a thin metal contact also on the back surface, which thin metal contact could then be patterned. However, this would easily lead to an unacceptably high leakage current in the detector. The PN junction at the interface between cadmium telluride and indium is vital in curbing the leakage current.

SUMMARY OF THE INVENTION

An objective of the present invention is to present a method for patterning a solid-state semiconductor detector. A further objective of the present invention is to present a patterning method that is applicable to detector crystals having thick diffused layers. Yet another objective of the invention is to present a patterned semiconductor detector with low leakage current and small number of lattice faults.

The objectives of the invention are achieved by selectively removing material from the surface of a layered structure where a diffused layer covers a semiconductor crystal, so that grooves thus produced penetrate deeper into said layered structure than the thickness of said diffused layer.

A method according to the invention is characterized in that it comprises:

selectively removing material from a surface of said semiconductor radiation detector crystal, thus producing a groove in said surface that penetrates deeper than the thickness of a diffused layer on said surface.

A semiconductor detector according to the invention is characterized in that it comprises:

a detector crystal made of a semiconductor material,
a diffused layer of a substance on a back surface of said detector crystal, said diffused layer giving rise to a PN junction between a front surface and said back surface of the detector crystal, and
a groove in said back surface that penetrates deeper into the detector crystal than the thickness of said diffused layer.

The thickness of the diffused layer means that selectively removing material from that side of the detector crystal must be accomplished with a method that will reach deep enough into the crystal without causing excessive damage to the lattice structure. Suitable methods include at least the use of a spatially controllable Q-switched laser, sawing, and plasma etching.

A Q-switched laser is a device capable of creating an exceptionally high power density at a very small focal point area. If focused on a surface, the output pulse of a Q-switched laser will convert a part of the surface material into a state of plasma, so that a certain amount of the material is ejected leaving an empty cavity on the surface. Repeated application of Q-switched laser pulses at the same location will make the cavity deeper, and moving the focal point across the surface will cause a groove to be created.

A detector crystal that has a relatively thick diffused layer on its back surface can be patterned by using a Q-switched laser to "saw" grooves in the back surface. If the grooves reach deeper than the thickness of the diffused layer, and if a groove or a number of intersecting grooves form a closed contour, they effectively isolate an island or a number of islands of the diffused material from the remaining parts of the original crystal surface. If independent electric contacts are made to a number of islands so isolated, the charge collected by each island can be separately measured, which means that the detector has spatial resolution.

Using a Q-switched laser to produce said grooves has the advantage that the amount of excess energy that is distributed to the remaining atoms of the crystal lattice is relatively low, resulting in a correspondingly low number of permanent faults introduced into the crystal lattice. If cleaning of the grooves is nevertheless required, it can be done by e.g. wet etching. Since the Q-switched laser eats its way easily through a photoresist, it is not necessary to preproduce any patterns into the resist layer before the application of the Q-switched laser.

Other viable methods for producing the grooves include but are not limited to mechanical sawing and plasma etching.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE INVENTION

Q-switched lasers represent known technology, but for clarity some of their features are summarized here. Passive Q-switching involves using a piece of optical gain medium in connection with a saturable absorber, also known as the passive Q-switch. Optical energy is pumped into the gain medium using e.g. a so-called pump laser. A saturation effect in the absorber leads to a rapid reduction of resonator loss, so that energy temporarily stored in the gain medium is instantaneously extracted in the form of a laser pulse. The cycle of storing and releasing energy is repeated at a rate determined by the pumping power and the characteristics of the saturable absorber. As a difference to passive Q-switching, active Q-switching involves using a medium with actively controllable optical characteristics in place of the saturable absorber.

A laser machining apparatus that employs a Q-switched laser typically includes controllable focusing means, with which it is possible to choose very exactly the location at which the laser pulses will hit the target surface, and also to move the focal point of the laser pulses very exactly across the target surface along a predefined route. The controllable focusing means may include e.g. piezoelectrically controlled mirrors, lenses and so forth. The predefined route, along which the focal point should be moved, may include straight sections, curved sections and discontinuities (which are implemented by switching the laser on and off according to need). The speed at which the focal point will be moved, as well as the output power of the Q-switched laser system can be controlled exactly. This means that when the resistance of the target material to laser machining is known, it is possible to predict relatively exactly, how deep a groove will result from a certain movement of the focal point across the target surface.

Figure 1:
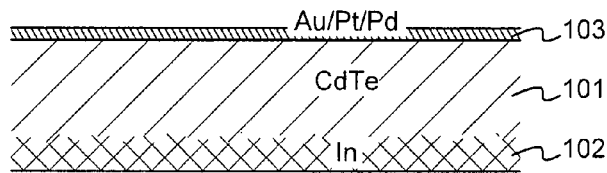
FIG. 1 illustrates a known, unpatterned CdTe semiconductor detector.
Figure 2:
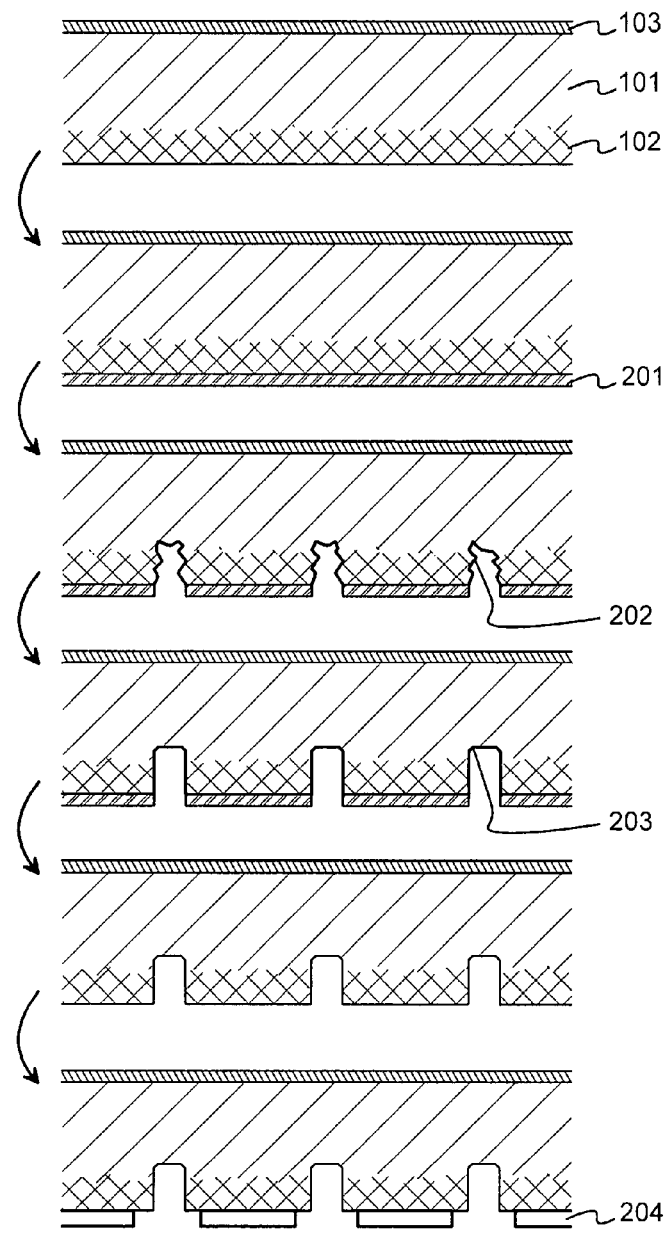
FIG. 2 illustrates the preparation of a patterned detector crystal.

In FIG. 2 the topmost cross-section represents a detector crystal 101 that comprises a relatively thick diffused layer 102 on its back surface and a thin contact layer 103 on its front surface. Actually it is quite irrelevant whether the detector crystal comprises anything on its front surface at this moment; the thin contact layer 103 is there merely to underline that prepared crystals of this kind are easily obtained e.g. from production lines that conventionally have produced non-patterned detectors of the type illustrated in FIG. 1. Similarly to FIG. 1 also here the layer thicknesses are not to scale.

In FIG. 2 we assume that some further processing steps will benefit from the application of a photoresist layer 201 onto the back surface of the crystal. After applying the photoresist a Q-switched laser is used to produce initial grooves 202 that penetrate from the back surface deep enough into the crystal 101 to go through the diffused layer 102. Depending on the accuracy of controlling the Q-switched laser apparatus and other factors, the initial grooves 202 may first have somewhat rough edges. Wet etching is used to clean and smooth the grooves, so that nice clean final grooves 203 are produced. Assuming that the photoresist layer 201 is not needed for anything else, it can be removed. In order to utilize the thus accomplished patterning there are formed some kinds of contacts 204 and possibly readout electronics onto the exposed surfaces of the patterns, using known methods of semiconductor circuit production.

Figures 3, 4:
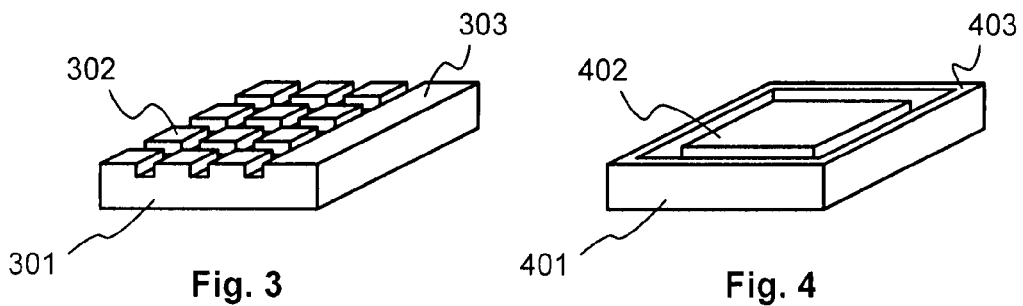
FIG. 3 illustrates a patterned detector crystal with pixels.
FIG. 4 illustrates a patterned detector crystal with a guard ring.

Some possible results of patterning are shown in FIGS. 3 and 4. FIG. 3 illustrates schematically a patterned detector crystal 301, the back surface of which comprises pixels 302 separated from each other by laser-machined grooves. One portion 303 of the back surface has been left without grooves to enable using it the substrate for readout electronics. FIG. 4 illustrates schematically a patterned detector crystal 401 which does not need to have spatial resolution, but in which a guard ring consisting of a groove in the form of a closed curve separates a central part 402 from an edge portion 403. Many other ways of patterning, including but not being limited to various combinations of the principles shown in FIGS. 3 and 4, are possible.

Figure 5:
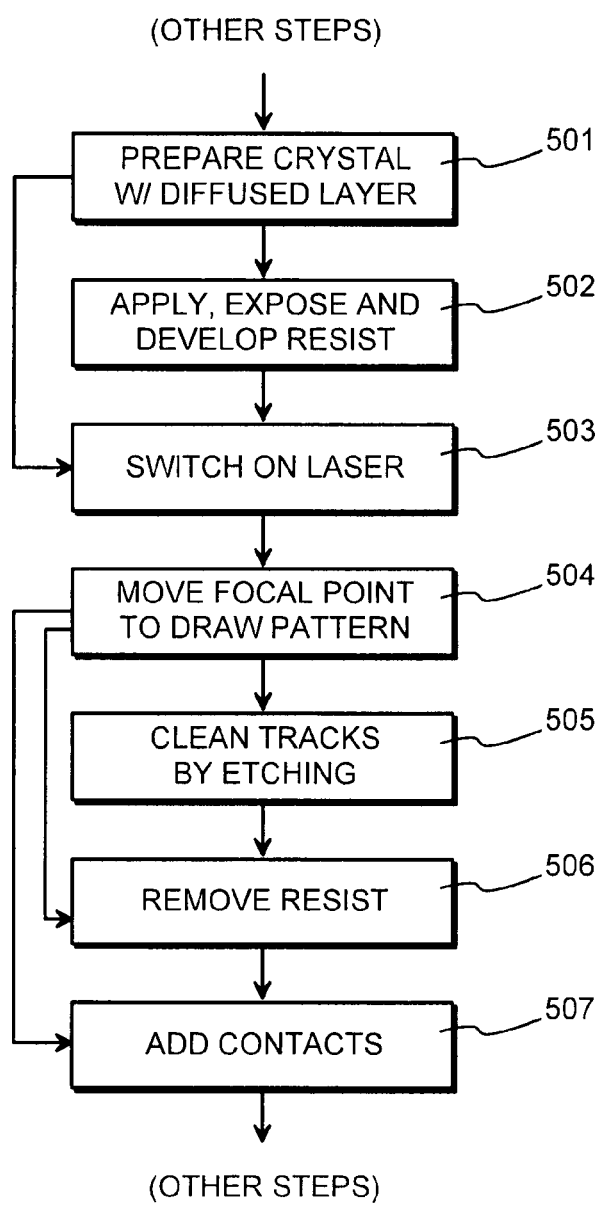
FIG. 5 illustrates a method for patterning a detector crystal.

FIG. 5 illustrates a method according to an embodiment of the invention. At some stage of manufacturing a semiconductor radiation detector, there is prepared a crystal with a relatively thick diffused layer on its back side according to step 501. Whether or not the process involves applying a resist on the surface of the diffused layer is not important to the invention, which in FIG. 5 is illustrated as a possible straight transition from step 501 to step 503 as an alternative to the route going through the step 502 of applying a resist. Even if a resist is used to protect those portions of the diffused surface against a later etching step that should remain intact, it is interesting to note that step 502 does not need to include using any masks or other ways to pattern the resist, because the laser will easily go through the resist also. Thus it is sufficient to apply a smooth, even layer of resist in step 502 and expose and develop it all, if a resist is needed.

Using a Q-switched laser to machine grooves through the diffused layer is illustrated relatively simply as switching on the laser in step 503, focusing the Q-switched laser into a focal point on the surface to be machined and moving the focal point across the surface in step 504. In practice, especially if the groove patterns to be produced are complicated, the machining phase may include numerous steps of controlling the use of the laser in various ways. Moving the focal point may include moving the laser apparatus, otherwise controlling the aim of the laser apparatus, moving the crystal in relation with the laser apparatus, or a combination of any of these.

If the laser machining leaves the grooves clean enough, it is possible that no etching is required, but for the sake of completeness a possible etching step is illustrated as step 505. Here we also assume that the resist that was possibly applied in step 502 was there indeed for the purpose of protecting the desired remaining portions of the diffused surface, so the remaining resist can be removed in step 506. Step 507 involves producing the required contacts and possibly other circuit elements on the patterned surface according to need, using techniques known as such.

If mechanical sawing or plasma etching is used to produce the grooves, steps 503 and 504 are replaced by switching on the appropriate tooling apparatus and moving the tooling blade or plasma cannon in relation to the semiconductor crystal (again, all possible ways of causing relative movement are possible).

It should be noted that even if we speak above about producing a single detector, it is in many cases most advantageous to handle an array of detector preforms simultaneously, so that they are all produced from a single cadmium telluride wafer that goes through the process illustrated in FIG. 5.

We claim:

1. A method for patterning a semiconductor radiation detector crystal, comprising:
    selectively removing material from a surface of a semiconductor radiation detector crystal comprising cadmium telluride, thus producing a groove in said surface that penetrates deeper than the thickness of a diffused layer of indium on said surface, wherein said thickness is the original thickness of said diffused layer of indium after diffusing.

2. A method according to claim 1, comprising isolating an island of diffused material on said surface from other parts of said surface by producing a groove that constitutes a closed curve around said island of diffused material.

3. A method according to claim 2, comprising isolating a plurality of islands of diffused material on said surface from each other, and making independent electric contacts to a number of islands so isolated, said independent electric contact being adapted to enable measuring an amount of charge collected by each of said number of islands separately.

4. A method according to claim 2, comprising isolating a portion of diffused material on said surface from a remainder of said surface with a guard ring that comprises a groove in the form of a closed curve around said portion of diffused material on said surface.

5. A method according to claim 1, wherein the selective removing of material is accomplished by focusing a Q-switched laser into a focal point on said surface and moving the focal point in relation to said semiconductor radiation detector crystal.

6. A method according to claim 5, comprising:
    using wet etching to remove material from a groove produced with said Q-switched laser.

7. A method according to claim 6, comprising:
    prior to using said Q-switched laser to selectively remove material from said surface, covering said surface with a resist
    using said Q-switched laser to selectively remove both resist and material of said semiconductor radiation detector crystal to produce said groove, and leaving a portion of resist intact on a portion of said surface, and
    utilizing said portion of resist that was left intact to protect said portion of said surface during said wet etching.

8. A method according to claim 1, wherein the selective removing of material is accomplished by mechanically sawing off material.

9. A method according to claim 1, comprising selectively removing material from said surface by plasma etching.

10. A method for patterning a semiconductor radiation detector crystal, comprising:
    covering a surface of said semiconductor radiation detector crystal with a layer of hardened resist,
    selectively removing material from said surface with a method that penetrates and removes hardened resist from those parts of said surface from which material is selectively removed, at the same time when said material is selectively removed, thus producing a groove in said surface that penetrates deeper than the thickness of a diffused layer on said surface, and
    cleaning said groove with an etching method that leaves resist-covered parts of said surface unetched.

11. A method according to claim 10, wherein said method that penetrates and removes said hardened resist is one of: focusing a Q-switched laser into a focal point on said surface and moving the focal point in relation to said semiconductor radiation detector crystal; mechanically sawing off material from said surface.

* * * * *